(12) United States Patent
Linford et al.

(10) Patent No.: US 11,746,418 B2
(45) Date of Patent: Sep. 5, 2023

(54) CHEMICAL VAPOR DEPOSITION OF THICK INORGANIC COATING ON A POLARIZER

(71) Applicant: Moxtek, Inc., Orem, UT (US)

(72) Inventors: Matthew R. Linford, Orem, UT (US); Brian Johnson, Santaquin, UT (US); Anubhav Diwan, Provo, UT (US)

(73) Assignee: Moxtek, Inc., Orem, UT (US)

( * ) Notice: Subject to any disclaimer, the term of this patent is extended or adjusted under 35 U.S.C. 154(b) by 432 days.

(21) Appl. No.: 16/674,195

(22) Filed: Nov. 5, 2019

(65) Prior Publication Data

US 2020/0173021 A1 Jun. 4, 2020

Related U.S. Application Data

(60) Provisional application No. 62/774,414, filed on Dec. 3, 2018.

(51) Int. Cl.
| | |
|---|---|
| *C23C 16/455* | (2006.01) |
| *C23C 16/40* | (2006.01) |
| *C23C 16/48* | (2006.01) |
| *C23C 16/56* | (2006.01) |
| *G02B 5/30* | (2006.01) |
| *C23C 16/50* | (2006.01) |
| *C23C 16/448* | (2006.01) |
| *C23C 16/02* | (2006.01) |

(52) U.S. Cl.
CPC ........ *C23C 16/45548* (2013.01); *C23C 16/02* (2013.01); *C23C 16/402* (2013.01); *C23C 16/4485* (2013.01); *C23C 16/48* (2013.01); *C23C 16/50* (2013.01); *C23C 16/56* (2013.01); *G02B 5/3025* (2013.01)

(58) Field of Classification Search
CPC ..... C23C 16/02; C23C 16/402; C23C 16/448; C23C 16/4485; C23C 16/45523; C23C 16/45548; C23C 16/48; C23C 16/50; C23C 16/56; C23C 14/046; G02B 5/3025; G02B 1/14
USPC .... 427/534, 535, 539, 576, 579, 163.1, 166, 427/167, 255.15, 255.18, 255.19, 255.32, 427/255.34, 255.36, 255.37, 255.1, 8
See application file for complete search history.

(56) References Cited

U.S. PATENT DOCUMENTS

| | | | |
|---|---|---|---|
| 7,820,255 B2 | 10/2010 | Okubo et al. | |
| 9,995,864 B2 * | 6/2018 | Diwan | C23C 16/308 |
| 10,025,015 B2 * | 7/2018 | Linford | C23C 16/308 |
| 10,054,717 B2 * | 8/2018 | Wangensteen | G02B 1/14 |
| 10,074,825 B2 | 9/2018 | Hirosawa | |
| 10,408,983 B2 * | 9/2019 | Nielson | G02B 5/3058 |
| 10,534,120 B2 * | 1/2020 | Nielson | C23C 16/44 |
| 10,752,989 B2 * | 8/2020 | Diwan | C23C 16/402 |
| 2006/0062917 A1 * | 3/2006 | Muthukrishnan | C23C 16/401 427/248.1 |

(Continued)

*Primary Examiner* — Dah-Wei D. Yuan
*Assistant Examiner* — Kristen A Dagenais

(57) ABSTRACT

Thick, inorganic coatings can be deposited on a polarizer by chemical vapor deposition. In one embodiment, the method can comprise activating a surface of the polarizer with an oxygen plasma in an oven; injecting a solution including tetrakis(dimethylamino)silane dissolved in cyclohexane and water into the oven; and vapor depositing silicon dioxide onto the polarizer. These three steps can be repeated multiple times until desired thickness is attained.

9 Claims, 3 Drawing Sheets

(56) References Cited

U.S. PATENT DOCUMENTS

| | | | |
|---|---|---|---|
| 2008/0240479 A1* | 10/2008 | Linford | B05D 1/60 427/535 |
| 2010/0323207 A1* | 12/2010 | Pinault | C01B 32/162 427/249.1 |
| 2013/0146860 A1 | 6/2013 | Toyama | |
| 2013/0199982 A1* | 8/2013 | Linford | B01J 20/284 427/337 |
| 2015/0099126 A1* | 4/2015 | Honda | H01L 51/5253 428/412 |
| 2015/0132587 A1 | 5/2015 | Nishio | |
| 2015/0364720 A1 | 12/2015 | Itoh | |
| 2016/0056412 A1* | 2/2016 | Hirosawa | H10K 50/844 257/40 |
| 2016/0291208 A1* | 10/2016 | Wangensteen | G02B 5/3058 |
| 2016/0291209 A1* | 10/2016 | Diwan | C23C 16/403 |
| 2016/0291226 A1* | 10/2016 | Linford | G02B 1/14 |
| 2017/0293059 A1* | 10/2017 | Nielson | C23C 14/02 |
| 2018/0269480 A1 | 9/2018 | Kim et al. | |
| 2020/0363577 A1* | 11/2020 | Nielson | C09D 183/04 |

\* cited by examiner

CHEMICAL VAPOR DEPOSITION OF THICK INORGANIC COATING ON A POLARIZER

CLAIM OF PRIORITY

This application claims priority to U.S. Provisional Patent Application No. 62/774,414, filed on Dec. 3, 2018, which is incorporated herein by reference.

FIELD OF THE INVENTION

The present application is related generally to polarizers.

BACKGROUND

Polarizers, such as for example wire grid polarizers and metamaterial polarizers, can have raised structures and gaps between the raised structures. For protection of these raised structures, the gaps can be filled with a material. Atomic layer deposition (ALD) is one way to fill these gaps, but ALD can be slow expensive. It would be beneficial to find a more economical method of filling these gaps.

SUMMARY

It has been recognized that it would be advantageous to provide an economical method for filling gaps between raised structures in a polarizer. The present invention is directed to various methods of applying a coating on a polarizer that satisfy this need.

In one embodiment, the method can comprise injecting a solution into an oven, injecting water into the oven, and vapor depositing a metal oxide coating onto the polarizer. The solution can include a water-reactive metal oxide precursor dissolved in an organic solvent.

In another embodiment, the method can comprise performing a deposition step at least three times, the deposition step including the following steps in the following order: activating a surface of the polarizer with an oxygen plasma; injecting a solution including tetrakis(dimethylamino)silane dissolved in cyclohexane and water into the oven; and vapor depositing silicon dioxide onto the polarizer.

In another embodiment, the method can comprise placing the polarizer into an oven; injecting a metal oxide precursor into the oven; reacting the polarizer, the metal oxide precursor, or both, with a water gas, an oxygen plasma, an ozone gas, or combinations thereof, in the oven; and vapor depositing a metal oxide coating onto the polarizer in the oven.

BRIEF DESCRIPTION OF THE DRAWINGS (DRAWINGS MIGHT NOT BE DRAWN TO SCALE)

DEFINITIONS

As used herein, the phrase "filling gaps" means completely filling the gaps, filling the gaps as completely as possible within normal manufacturing tolerances using the methods of the invention disclosed herein, or nearly completely filling the gaps, such that any deviation from completely filling would have negligible effect for ordinary use of the device.

As used herein, the term "metal oxide" includes both metal oxides and metalloid oxides.

As used herein, the term "nm" means nanometer(s).

As used herein, the term "oxygen plasma" means that the plasma includes a substantial amount of oxygen, such as for example ≥10% oxygen, ≥50% oxygen, or ≥90% oxygen. Air can be used for the oxygen plasma.

DETAILED DESCRIPTION

A method of applying a coating on a polarizer can comprise some or all of the following steps, which can be performed in the following order or other order if so specified. Some of the steps can be performed simultaneously unless explicitly noted otherwise in the claims. There may be additional steps not described below. These additional steps may be before, between, or after those described.

Figure 1:
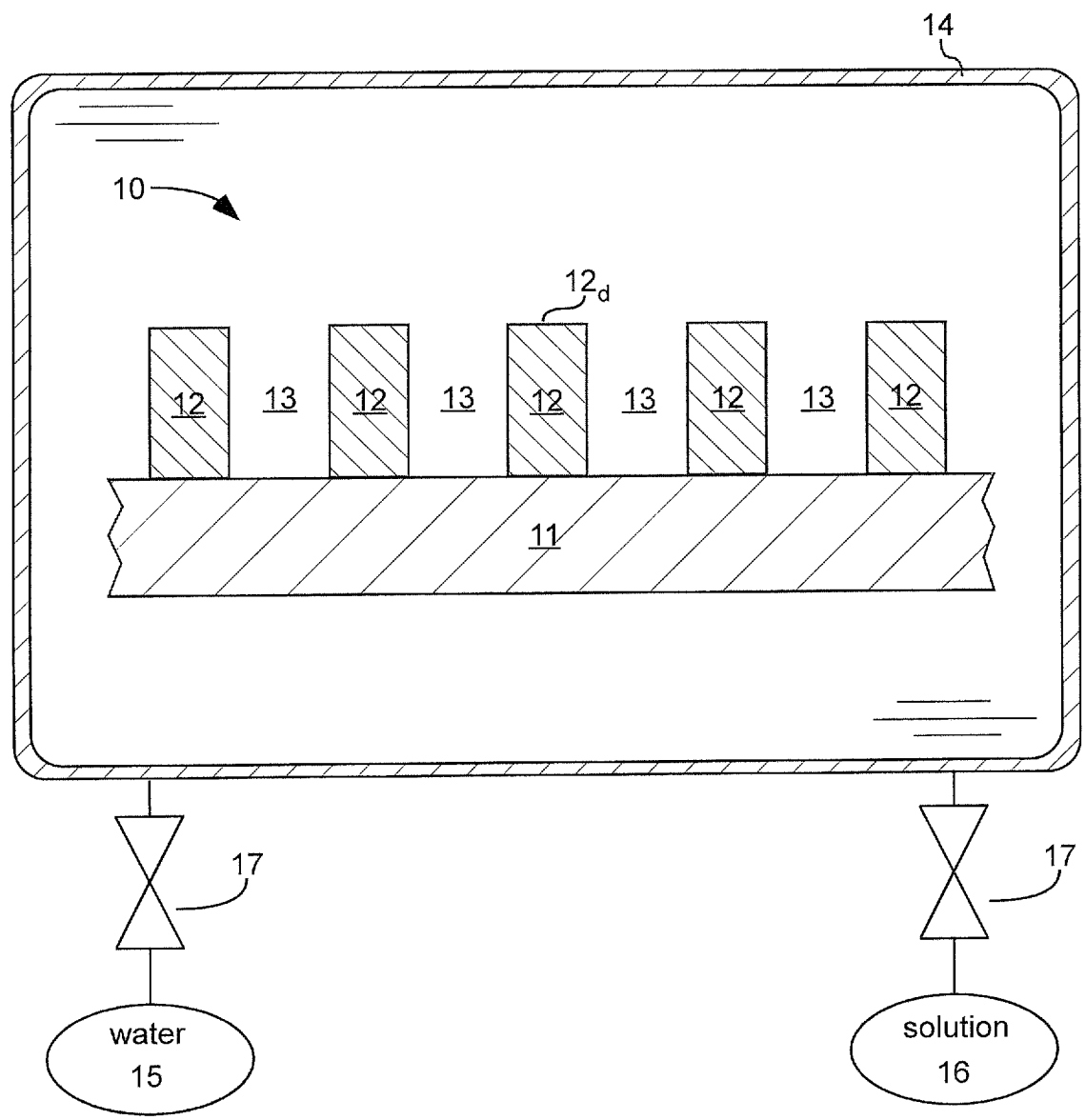
FIG. 1 is a schematic cross-sectional side-view of a polarizer 10 in an oven 14, in accordance with an embodiment of the present invention.
Figure 3:
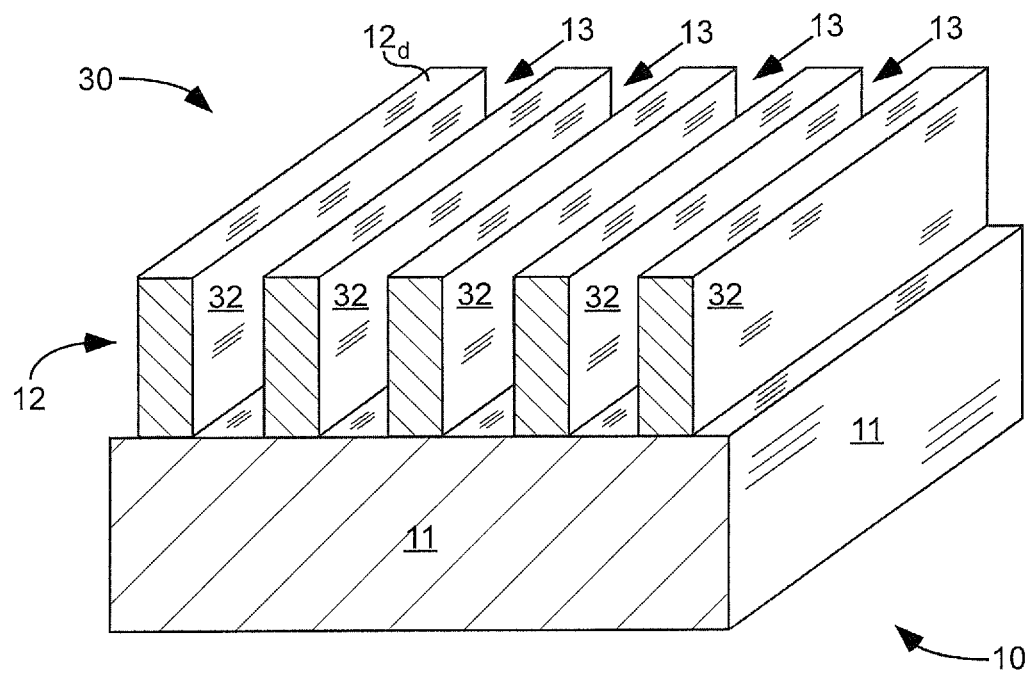
FIG. 3 is a schematic perspective-view of a wire grid polarizer 30, in accordance with an embodiment of the present invention.
Figure 4:
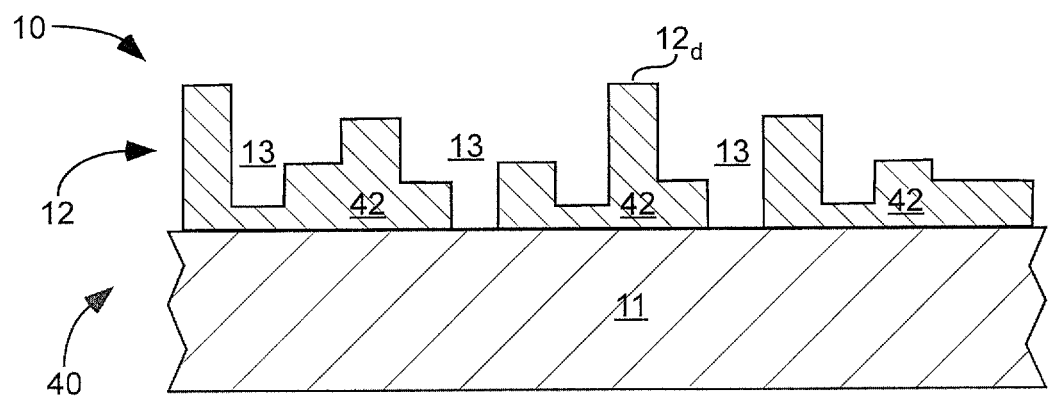
FIG. 4 is a schematic cross-sectional side-view of a metamaterial polarizer 40, in accordance with an embodiment of the present invention.

As illustrated in FIG. 1, a polarizer 10 can be placed into an oven 14. The polarizer 10 can include raised structures 12 extending from a substrate 11. There can be gaps 13 between the raised structures 12. As illustrated in FIG. 3, in one embodiment the polarizer 10 can be a wire grid polarizer 30 and the raised structures 12 can be an array of parallel, elongated wires 32. As illustrated in FIG. 4, in another embodiment the polarizer 10 can be a metamaterial polarizer 40 and the raised structures 12 can be a variety of subwavelength, dielectric structures 42 extending in different directions and with different thicknesses extending outwards from the substrate 11.

Figure 2:
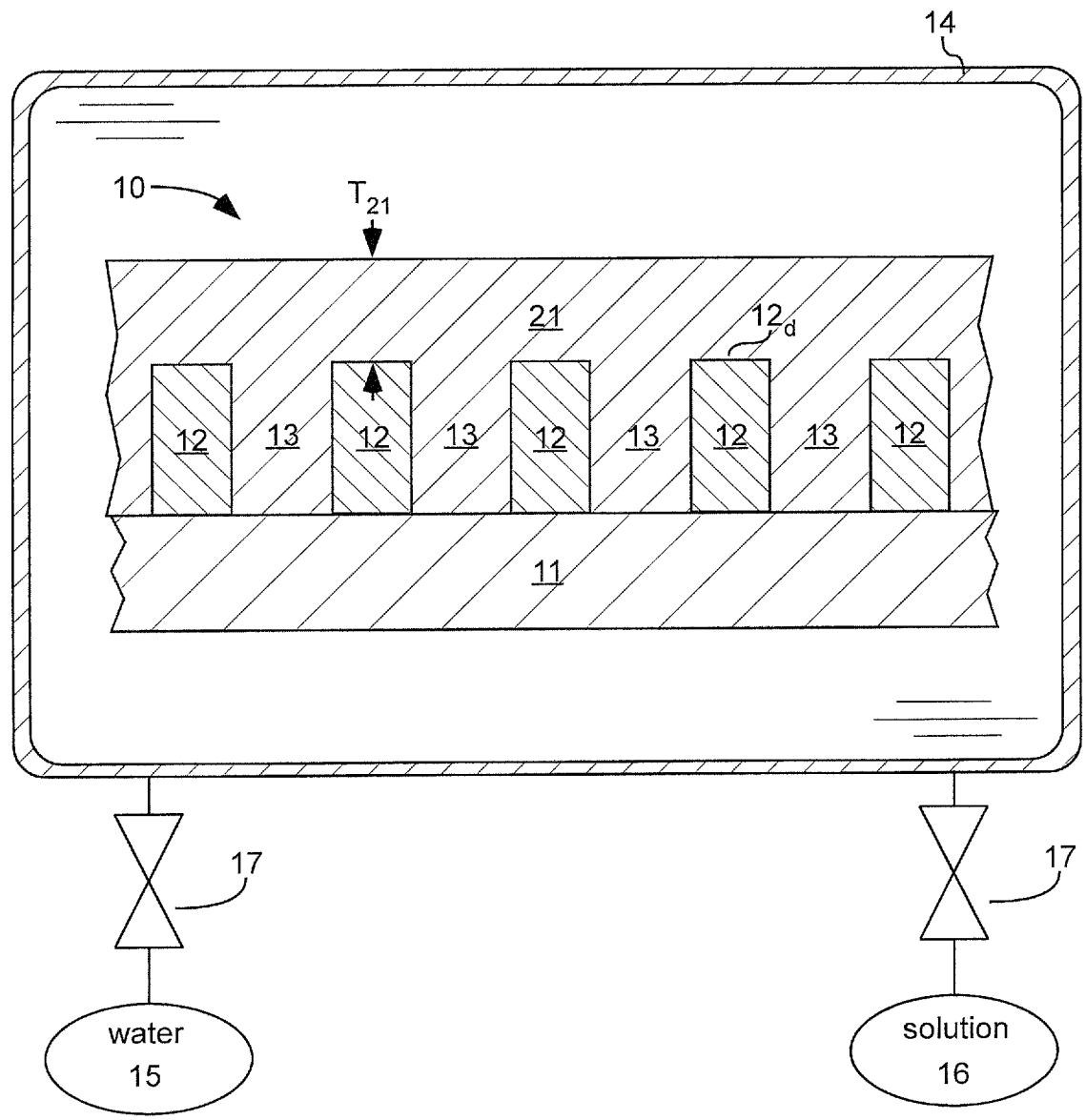
FIG. 2 is a schematic cross-sectional side-view of the polarizer 10, illustrating vapor depositing a metal oxide coating 21 onto the polarizer, in accordance with an embodiment of the present invention.

As illustrated in FIG. 2, a step in the method can include vapor depositing a metal oxide coating 21 onto the polarizer 10. By the method herein, the metal oxide coating 21 can fill gaps 13 between the raised structures 12. The metal oxide coating 21 can also cover a distal end $12_d$ of the raised structures 12, farthest from the substrate 11, forming a continuous layer of the metal oxide coating 21 over the raised structures 12 at the distal end $12_d$.

Following are examples of chemistry of the metal oxide coating 21. The metal oxide coating 21 can include silicon dioxide (e.g. ≥50%, ≥75%, or ≥90% silicon dioxide); titanium oxide (e.g. ≥50%, ≥75%, or ≥90% titanium oxide); aluminum oxide (e.g. ≥50%, ≥75%, or ≥90% aluminum oxide); or combinations thereof. Due to variation in deposition, the metal oxide coating 21 can include nonstoichiometric ratios of the aforementioned chemicals. For example, silicon dioxide includes $Si_xO_y$, where $0.8 \leq x \leq 1.2$ and $1.8 \leq y \leq 2.2$; titanium oxide includes $Ti_xO_y$, where $0.8 \leq x \leq 1.2$ and $1.8 \leq y \leq 2.2$; and aluminum oxide includes $Al_xO_y$, where $1.8 \leq x \leq 2.2$ and $2.8 \leq y \leq 3.2$.

As illustrated in FIG. 2, a container of a solution 16, a container of water 15, or both, can be attached to the oven 14. Valve(s) 17 can be opened to draw the solution 16, the water 15, or both, into the oven 14. The solution 16 and the water 15 can alternatively be pumped into the oven. The oven 14 can have an internal pressure and temperature for the solution, the water, or both to be a gas inside of the oven 14.

The solution 16 can include a metal oxide precursor. The metal oxide precursor can be water-reactive, and thus water gas can activate and improve deposition of the metal oxide precursor. For example, the metal oxide precursor can include one or more of the following: trimethyl aluminum for formation of aluminum oxide; tetrakis(dimethylamino) silane, $SiCl_4$, $Si(OCH_3)_4$, $Si(OCH_2CH_3)_4$, or combinations thereof for formation of silicon dioxide; $TiCl_4$, $TiBr_4$, $Ti(N(CH_3)_2)_4$, or combinations thereof for formation of titanium oxide. A catalyst, such as for example an acid or a base, can improve speed of reaction of the metal oxide precursor.

In one embodiment, the metal oxide precursor can be dissolved in an organic solvent. The organic solvent can minimize premature reaction, such as polymerization, of the metal oxide precursor. If the metal oxide precursor is water-reactive, then it can be helpful for the organic solvent to have low water solubility, such as for example ≤0.05 mol/L, ≤0.01 mol/L, ≤0.005 mol/L, or ≤0.004 mol/L, each at 25° C. One example of the organic solvent is cyclohexane.

Optimization of a ratio of the metal oxide precursor and the organic solvent can improve stability of the solution and subsequent reaction of the metal oxide precursor in formation of the metal oxide coating 21. For example, the solution 16 can include ≥10 and ≤40 volumetric percent tetrakis(dimethylamino)silane dissolved in ≥60 and ≤90 volumetric percent cyclohexane.

Metal oxide coating 21 formation can be increased by combining the metal oxide precursor in the oven 14 with a water gas, an oxygen plasma, an ozone gas, or combinations thereof. The method can include injecting water into the oven, generating oxygen plasma in the oven 14, injecting or forming an ozone gas 14, or combinations thereof. An example volumetric percent ratio of the solution 16 to the water 15 injected into the oven 14 is between 0.5:1 and 1:0.5.

Deposition of the metal oxide coating 21 can slow then stop. Following is a deposition step, typically performed in the following order, which can be repeated multiple times (e.g. ≥2 times, ≥3 times, ≥5 times, or ≥2 times, ≥2 times,) and reactivate the reaction so that it will continue, resulting in a thicker metal oxide coating 21. Repeating the following deposition step can result in thicker inorganic coatings than typically result from chemical vapor deposition.

A first part of the deposition step can be activating a surface of the polarizer 10 with a plasma. This surface of the polarizer 10 can be the raised structures 12, the substrate 11, the metal oxide coating 21 already deposited, or combinations thereof. The plasma can activate the surface and facilitate deposition during the following steps.

A second part of the deposition step can be injecting the solution 16 and the water 15 into the oven 14. Injection of the solution 16 and the water 15 can be done sequentially with the solution 16 first then the water 15 or with the water 15 first then the solution 16, or can be done simultaneously.

A third part of the deposition step can be vapor depositing the metal oxide coating 21 onto the polarizer 10. When deposition during the third step slows, these three deposition steps can be repeated, with the first step activating the surface for additional deposition.

Use of water 15 plus the repeated deposition step just discussed can result in thicker coatings than is typical for chemical vapor deposition. For example, the metal oxide coating 21 can have a thickness of ≥20 nm, ≥30 nm, ≥40 nm, ≥50 nm, or ≥60 nm.

What is claimed is:

1. A method of applying a silicon dioxide coating on a polarizer in an oven, the method comprising performing a deposition step in the oven at least three times, the deposition step including the following steps in the following order:
    activating a surface of the polarizer with an oxygen plasma;
    injecting a solution and water into the oven, the solution including tetrakis(dimethylamino)silane dissolved in cyclohexane, and the oven having an internal pressure and temperature for the solution and the water to be a gas inside of the oven; and
    reacting the tetrakis(dimethylamino)silane with the water to vapor deposit the silicon dioxide coating onto the surface of the polarizer, wherein vapor depositing the silicon dioxide coating onto the polarizer includes:
    filling gaps between raised structures on the polarizer the raised structures extending from a substrate; and
    covering a distal end of the raised structures, farthest from the substrate, forming a continuous layer of the silicon dioxide coating over the raised structures at the distal end.

2. A method of applying a metal oxide coating on a polarizer, the method comprising:
    performing a deposition step in an oven at least two times, each deposition step including steps (a) through (d): (a) activating a surface of the polarizer with a plasma; (b) injecting a solution into the oven, the solution including a water-reactive metal oxide precursor dissolved in an organic solvent, the oven having an internal pressure and temperature for the solution to be a gas inside of the oven; (c) injecting water into the oven, the oven having an internal pressure and temperature for the water to be a gas inside of the oven; and (d) reacting the metal oxide precursor with the water to vapor deposit the metal oxide coating onto the polarizer in the oven; and
    filling gaps between raised structures on the polarizer the raised structures extending from a substrate, covering a distal end of the raised structures, farthest from the substrate, forming a continuous layer of the metal oxide coating over the raised structures at the distal end, and forming the metal oxide coating with a thickness of ≥30 nm.

3. The method of claim 2, wherein an order of steps of the deposition step is (a), then (b) and (c), then (d).

4. The method of claim 2, wherein a volumetric percent ratio of the solution to the water injected into the oven is between 0.5:1 and 1:0.5.

5. The method of claim 2, wherein the deposition step is performed at least three times, the deposition step including the following steps in the following order:
    activating the surface of the polarizer with the plasma;
    injecting the solution and the water into the oven; and
    vapor depositing the metal oxide coating onto the surface of the polarizer.

6. The method of claim 5, wherein the plasma is an oxygen plasma, an air plasma, or both.

7. The method of claim 2, wherein the organic solvent has a water solubility of ≤0.01 mol/L at 25° C.

8. The method of claim 2, wherein the water-reactive metal oxide precursor includes tetrakis(dimethylamino)silane, the organic solvent includes cyclohexane, and the metal oxide coating includes silicon dioxide.

9. The method of claim 8, wherein the solution includes ≥10 and ≤40 volumetric percent tetrakis(dimethylamino)silane dissolved in ≥60 and ≤90 volumetric percent cyclohexane.

* * * * *